United States Patent

Wang

[15] 3,658,586

[45] Apr. 25, 1972

[54] EPITAXIAL SILICON ON HYDROGEN MAGNESIUM ALUMINATE SPINEL SINGLE CRYSTALS

[72] Inventor: Chih Chun Wang, Hightstown, N.J.

[73] Assignee: RCA Corporation

[22] Filed: Apr. 11, 1969

[21] Appl. No.: 815,391

[52] U.S. Cl. ................................117/201, 23/52, 23/273 V, 23/304, 106/42, 117/106 A, 117/227, 148/1.5, 148/175, 117/213, 148/1.6

[51] Int. Cl. .......................C23c 11/00, H01l 7/62, C01f 7/02

[58] Field of Search ...........................148/1.5, 1.6, 174, 175; 117/106, 201, 212, 213; 23/273 V, 295, 301, 304, 305, 52; 106/42; 317/101, 234, 235

[56] References Cited

UNITED STATES PATENTS

| | | | |
|---|---|---|---|
| 3,224,840 | 12/1965 | Lefever | 23/273 |
| 3,367,748 | 2/1968 | Hutcheson | 23/301 |
| 3,377,513 | 4/1968 | Ashby et al. | 317/101 |
| 3,414,434 | 12/1968 | Manasevit | 117/201 |
| 3,433,684 | 3/1969 | Zanowick et al | 117/106 X |
| 3,472,615 | 10/1969 | Wang | 23/52 |
| 3,476,617 | 11/1969 | Robinson | 148/175 |

OTHER PUBLICATIONS

Adamski, J. A. " New Oxy-Hydrogen Burner for Flame Fusion" J. Applied Physics, Vol. 36, No. 5, May 1965, pp. 1784–1786.

Schlötterer et al., Phys. Stat. Sol., 15, 399–411.

Filby & Nielsen " Single-Crystal Films of Silicon on Insulators" Brit. J. Appl. Phys., 1967, Vol. 18. pp. 1357–1382.

*Primary Examiner*—L. Dewayne Rutledge
*Assistant Examiner*—W. G. Saba
*Attorney*—Glenn H. Bruestle

[57] ABSTRACT

An improvement in the manufacture of integrated electronic circuits of the type including an insulating substrate and components occupying isolated portions of an epitaxial layer of a semiconductor material on the substrate, wherein the substrate consists of a plate of single-crystal magnesium aluminate spinel having the formula MgO. x $Al_2O_3$ where $x = 1.5$ to 2.5 and in which the method includes a step of annealing the substrate surface at a temperature of about 900°–1,400° C. The invention also includes an improved unit from which the circuit is made, comprising a single-crystal substrate body of magnesium aluminate spinel having the formula given above, where the spinel crystal contains about 0.00001 to 0.1 percent by weight of included hydrogen, and an epitaxial layer of silicon united to the substrate.

1 Claim, 2 Drawing Figures

Patented April 25, 1972 3,658,586

INVENTOR
Chih C. Wang

BY W. S. Hill
AGENT

EPITAXIAL SILICON ON HYDROGEN MAGNESIUM ALUMINATE SPINEL SINGLE CRYSTALS

The invention herein described was made in the course of or under a contract or subcontract thereunder with the Department of the Air Force.

BACKGROUND OF THE INVENTION

Integrated microelectronic circuits of the monolithic type using semiconductor substrates have certain disadvantages, such as unwanted parasitic capacitances of the back-biased P-N isolation junctions. Interaction of components within the substrate also cause the appearance of spurious transistors and other effects which it would be desirable to eliminate. Consequently, the industry has looked toward other types of microelectronic circuits affording more complete isolation between individual active and passive components of the circuit while still retaining the manufacturing advantages of the monolithic-type circuit where many components can be fabricated simultaneously on the same substrate within a restricted area.

One of the newer types of circuit structures includes a substrate composed of a body of insulating material of the type which permits a suitable epitaxial layer of a semiconductor material to be grown on a surface thereof. In this type of unit, many circuit components can be fabricated simultaneously just as in the more conventional monolithic type circuit, and then, after fabrication, portions of the semiconductor layer in between the components can be removed so that there is no interaction between components through the materials themselves.

In making this newer type of circuit, sapphire has proved to be a fairly satisfactory substrate material. However, sapphire has been found to have certain limitations, and a more satisfactory insulating substrate material has been sought. A material which has been found to be better than sapphire because it provides a better match in crystalline structure between substrate and semiconductor is magnesium aluminate spinel. This material can exist in a wide range of compositions. It can have the formula $MgO.xAl_2O_3$ where $x$ can have values from about 0.64 to about 6.7. A commercial single-crystal spinel is available in which $x$ equals approximately 3.3. Spinel of this composition can be grown most easily. The commercial spinel is usually grown by a flame fusion method. When an attempt was made to use this commercial spinel as a substrate for epitaxial silicon layers grown at about 1,100° C., in which microelectronic components were fabricated by conventional methods, including diffusion of impurities and formation of dielectric layers at about 1,100° to 1,200° C., difficulties were encountered because of the exsolution of alumina accompanied by cracking of the substrate during the exposure to the high temperatures. The alumina exsolution and the substrate cracking degrade the composite device structures.

It was also proposed to use magnesium aluminate spinel of stoichiometric ratio between the MgO and $Al_2O_3$, that is, a 1:1 ratio of the two components. This solved the problem of substrate thermal instability, but spinel having this composition is very difficult to prepare without strains and imperfections, and it has also proved to be difficult to cut without cracking.

In the prior art it has also been proposed to use magnesium aluminate spinel as a substrate for an epitaxial layer of silicon to be used for making integrated circuits where the molar ratio between magnesium oxide and the aluminum oxide can be anywhere between 1:1 and 1:5, but this prior art proposal did not specify flame fusion type spinel. Moreover, spinels with compositions, in terms of molar ratio of aluminum oxide to magnesium oxide, higher than 2.5 exhibit thermal instability at silicon device fabrication temperatures.

In utilizing magnesium aluminate spinel as a substrate for making microelectronic circuit components in epitaxial silicon layers, it has now been found that to successfully make large-area single-crystal silicon films suitable for circuit production, the silicon film must be as nearly perfect in crystalline structure as it is possible to achieve. The perfection of the semiconductor crystalline layer is determined by such factors as spatial relationship between the atomic arrangement in the substrate and the atomic arrangement in the appropriate crystallographic plane of the semiconductor. It also depends on the physical condition of the substrate surface. For these and other reasons, the condition of the dielectric substrate materials plays a decisive role in the manufacture of commercially successful microelectronic devices in this type of unit.

OBJECTS OF THE INVENTION

An object of the present invention is to provide a dielectric crystalline substrate material on which epitaxial layers of silicon can be grown of sufficiently high quality to make good microelectronic circuit devices.

A further object of the invention is to provide an improved method of manufacturing a microelectronic circuit of the type which comprises a single-crystal dielectric body of substrate material and an epitaxial layer of silicon united to the substrate wherein circuit components are fabricated within the semiconductor layer and isolated from each other by dielectric.

THE DRAWING

FIG. 1 is a cross-section view of a unit comprising spinel substrate and semiconductor epitaxial layer such as may be made in accordance with the present invention, and FIG. 2 is a similar view of a unit of FIG. 1 with a circuit component fabricated therein.

DESCRIPTION OF PREFERRED EMBODIMENT

Figure 1:
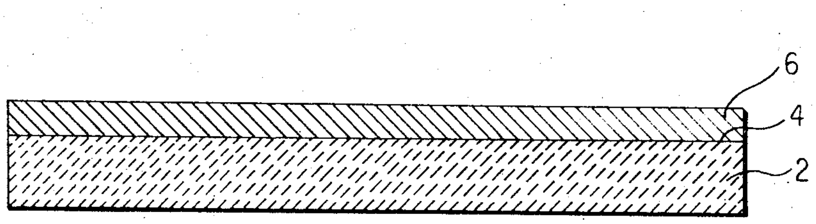

In order to practice the present invention, it is necessary to grow a single crystal body of magnesium aluminate spinel having a composition within a particular range. Because of the high melting point of the material (about 2,100° C.), the wide solid solubility range of the ingredients, the incongruent vaporization behavior (preferential loss of Mg), and the complicated precipitation phenomena within the crystal, it is difficult to grow high quality spinel single-crystals with controlled composition. Apparatus suitable for growing spinel single crystals of sufficient perfection for use in the present invention consists of a powder feed mechanism, a Verneuil burner, a ceramic growth furnace, a rotating seed holder and a lowering mechanism. The growth furnace is enclosed in a cabinet. During operation, the cabinet surrounding the furnace may be completely closed and the growing crystal is observed through two viewing ports which are equipped with adjustable filters and cross polarizers. The cabinet affords an even working temperature free from drafts which could cause thermal shock to the growing crystal.

The powder feed mechanism consists of a feed hopper assembly made of brass and a solenoid-operated tapping mechanism. The flow rate of feed powders is accurately controlled by both the intensity and frequency of tapping.

The Verneuil burner used in this apparatus should be designed with critical dimensions to avoid sharp turbulent mixing zones. The burner is preferably of the three-tube post-mixed type as described by J. Adamski, J. Appl. Phys., 36, P. 1,784 (1965). In this type of burner, oxygen is fed through both a center tube of the burner from the feed hopper and a side inlet to the outer concentric tube. Hydrogen is fed to the intermediate concentric tube through a heat-exchanger tee near the top of the burner.

The low aluminum-rich spinel feed powders used for crystal growth are prepared by calcining predetermined mixtures of co-precipitated recrystallized metal alums and sulfates of high purity at 1,100° C. for 3 hours. The feed powders are in the form of finely divided particles.

Crystals have been grown utilizing a self-seeding powder cone technique. In starting the spinel crystal growth from a powder cone, a sintered mass of material is built up on a high purity alumina tubing before melting. The initial growth of a narrow rod tends to produce a single crystal which can then be caused to grow wider by adjusting the growth parameters.

The growth process is controlled by three factors: (1) the hydrogen and oxygen gas flows, which govern the temperature and pattern of the flame, (2) the powder feed rate, and (3) the crystal-lowering rate. Typical growth conditions under steady state are: (1) hydrogen flow rate — 15 to 25 liters/min., (2) inner oxygen flow rate — 1 to 5 liters/min., (3) outer oxygen flow rate — 6 to 15 liters/min., and (4) crystal-lowering rate — 0.08 to 0.16 in./hr. Under these conditions a crystal about three-fourths to 1 in. diameter and 1 to 1½ in. long may be grown in a period of 8 to 10 hours using feed compositions in the range of $MgO$:1.7 $Al_2O_3$ to $MgO$:2.5 $Al_2O_3$. Longer growth periods are required for feeds with less alumina content.

In addition to the powder cone technique, crystals can also be grown on (100) oriented seeds using feeds of the same composition as the seed.

Substrate wafers of (111), (100), and (110) orientations have been prepared from the low aluminum-rich spinel single crystals. For substrate use, the (100) growth axes are the most desirable. Because the substrate quality is related directly to the epitaxial film perfection, accurate cutting followed by careful surface preparation is necessary for reproducibility of characteristics of the silicon-spinel composites.

Orientation of the spinel crystals for cutting is determined by the X-ray Laue back-reflection method. Spinel wafers about 20 mils thick were prepared by cutting the X-ray oriented crystals using a standard-type diamond wheel. An accuracy of better than ± ½° was maintained throughout the operation.

The next step in preparing a substrate on which to grow epitaxial layers is to mechanically lap and polish the wafer surface to produce a flat, smooth surface. Lapping can be carried out with about 30 micron boron carbide abrasives to obtain a flat co-planar surface. The lapped surface can be further polished using successively finer grades of alumina, generally ending with the 0.3 micron grade. After polishing, the wafers generally have a flatness of better than ± 0.4 micron/cm as revealed by interferometry.

Crystals which have been grown by the method described above have included hydrogen in the cation sites in the amount of from about 0.00001 to about 0.1 percent by weight. Experimental results indicate that the distribution of hydrogen in the cation sites depends upon the aluminum/magnesium ratio of the spinel host.

Although substrate wafers can be prepared from as-grown unannealed crystals, mechanical processing often produces cracks in such crystals grown from feeds having aluminum content of less than $MgO$:$2Al_2O_3$. The cracking can be eliminated by a post growth annealing treatment. Crystals grown from feed compositions of $MgO$:1.5 $Al_2O_3$ and Mgo:1.7 $Al_2O_3$ were annealed at 1,500° C. and 1,100° C., respectively, for 24 hours. It was found that this annealing treatment enhanced the mechanical stability of the crystals.

After mechanical polishing of a substrate wafer, surface damage, scratches, adsorbed layers, and impurity aggregates are generally found on the substrate surfaces. These surface imperfections cause defects in the subsequently grown epitaxial films. One way to remove most of these surface defects is to anneal the substrate wafer in hydrogen, preferably for example, at least 20 minutes to 1 hour at about 1,150° C. to 1,200° C., although temperatures of about 900° C. to about 1,400° C. may be used. However, hydrogen annealing does not remove most scratches.

Surface scratches that are caused by mechanical polishing and which cannot be removed by hydrogen annealing, may be removed by etching the spinel surface in $Na_2B_4O_7$ at 850° C.

On substrates prepared as described above, epitaxial layers of silicon can be grown by conventional methods. These methods include pyrolysis of silane ($SiH_4$) or the reduction of silicon tetrachloride. Either P or N type impurities may be introduced into the silicon layer during deposition.

As illustrated in FIG. 1, a unit of the above type may comprise a single-crystal spinel substrate wafer 2 in which the composition of the spinel is $MgO$:2 $Al_2O_3$ and in which the spinel contains about 0.01 percent by weight included hydrogen in cation sites.

On a major surface 4 of the substrate wafer 2, an expitaxial layer 6 of silicon is grown. This may be done by positioning the prepared wafer in a water-cooled furnace tube on a susceptor block with the polished face 4 of the substrate facing upward. While maintaining the substrate at about 1,100°–1,150° C., a mixture of 97 volume percent hydrogen and 3 volume percent silane is passed through the furnace. If the epitaxial layer is to be doped P-type, a second gaseous mixture comprising hydrogen and about 50 parts per million diborane is mixed with the first mixture. If the layer is to be doped N-type, the second mixture comprises hydrogen and 50 parts per million phosphine.

The silane, diluted with hydrogen, decomposes to form hydrogen and elemental silicon. The hydrogen passes out of the furnace tube while the silicon deposits on the polished and etched face 4 of the spinel substrate wafer 2 and grows as a monocrystalline layer. The rate of deposit of the silicon layer varies with: (1) the concentration of silane in the mixture, (2) the rate of flow of the mixture, and (3) the temperature in the furnace. The layer 6 may be grown to a thickness of 1 to 50 microns, for example.

Figure 2:
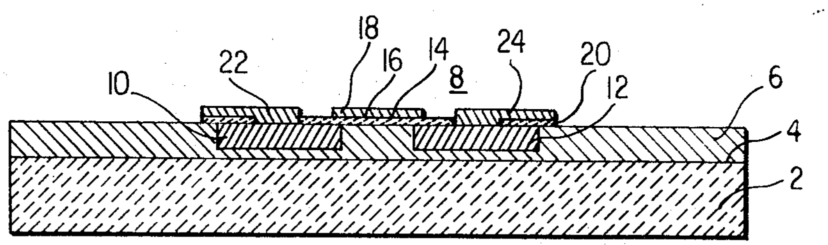

The epitaxial layer unit described above may be used to fabricate integrated circuits. Any of the circuit components, such as bipolar transistors, insulated gate field-effect transistors, diodes, resistors and capacitors may be fabricated into the epitaxial layer 6 by conventional methods. For example, (FIG. 2) the integrated circuit may include an insulated gate field-effect transistor 8 comprising a diffused source region 10, a diffused drain region 12, a channel surface region 14, gate insulation layer 16 and gate control electrode 18. The device may further include a layer of protective passivating oxide 20, a source electrode connection 22, and a drain electrode connection 24. If the silicon epitaxial layer 6 is assumed to be P-type, the source and drain regions may be made by diffusing in phosphorus from phosphorus oxychloride at a temperature of about 1,050° C. for about 15 minutes. The passivation layer 20 may consist of either silicon dioxide or silicon nitride, for example, and the metal connecting electrodes 22 and 24, as well as the gate electrode 18, may consist of a metal such as aluminum, gold, chromium, or palladium.

The gate insulation layer 16 may be formed by dry oxidation at 1,150° C. for 45 minutes using the spinel substrate made as described above having a composition in which the ratio of aluminum oxide to magnesium oxide is between 1.5 and 2.5. The processing steps which have just been described above do not cause cracking of the substrate or exsolution of the alumina out of the substrate.

If the ratio of aluminum oxide to magnesium oxide is greater than about 2.5, exsolution and cracking of the substrate do tend to occur. The difficulty increases as the aluminum to magnesium ratio rises.

It has thus been found that for the making of integrated circuits or layers of semiconductors deposited epitaxially on a spinel substrate, successful fabrication depends largely on use of the very narrow composition range of spinel specified herein.

What is claimed is:

1. An article of manufacture comprising a substrate of single-crystalline magnesium aluminate spinel grown by a flame fusion process having the formula $MgO.x\ Al_2O_3$, where $x = 1.5$ to 2.5, and where the crystal contains from about 0.00001 to 0.1 percent by weight included hydrogen, and an epitaxial layer of single-crystal silicon united to said substrate.

* * * * *